United States Patent
Widjaja

(10) Patent No.: US 10,818,354 B2
(45) Date of Patent: *Oct. 27, 2020

(54) SEMICONDUCTOR MEMORY HAVING VOLATILE AND MULTI-BIT NON-VOLATILE FUNCTIONALITY AND METHOD OF OPERATING

(71) Applicant: Zeno Semiconductor, Inc., Sunnyvale, CA (US)

(72) Inventor: Yuniarto Widjaja, Cupertino, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/239,456

(22) Filed: Jan. 3, 2019

(65) Prior Publication Data

US 2019/0156889 A1     May 23, 2019

Related U.S. Application Data

(60) Continuation of application No. 15/893,625, filed on Feb. 10, 2018, now Pat. No. 10,210,934, which is a
(Continued)

(51) Int. Cl.
*G11C 14/00* (2006.01)
*G11C 16/04* (2006.01)
(Continued)

(52) U.S. Cl.
CPC ...... *G11C 14/0018* (2013.01); *G11C 11/5671* (2013.01); *G11C 14/00* (2013.01);
(Continued)

(58) Field of Classification Search
CPC . G11C 14/00; G11C 14/0018; G11C 11/5671; G11C 16/0475; G11C 16/02;
(Continued)

(56) References Cited

U.S. PATENT DOCUMENTS 4,300,212 A   11/1981   Simko
4,363,110 A * 12/1982   Kalter ................... G11C 14/00
                                                         257/300
(Continued)

OTHER PUBLICATIONS

Chatterjee, et al. "Taper isolated dynamic gain RAM cell." Electron Devices Meeting, 1978 International. vol. 24. IEEE, 1978, pp. 698-699.
(Continued)

*Primary Examiner* — Vanthu T Nguyen
(74) *Attorney, Agent, or Firm* — Alan W. Cannon

(57) ABSTRACT

A semiconductor memory cell, semiconductor memory devices comprising a plurality of the semiconductor memory cells, and methods of using the semiconductor memory cell and devices are described. A semiconductor memory cell includes a substrate having a first conductivity type; a first region embedded in the substrate at a first location of the substrate and having a second conductivity type; a second region embedded in the substrate at a second location of the substrate and have the second conductivity type, such that at least a portion of the substrate having the first conductivity type is located between the first and second locations and functions as a floating body to store data in volatile memory; a trapping layer positioned in between the first and second locations and above a surface of the substrate; the trapping layer comprising first and second storage locations being configured to store data as nonvolatile memory independently of one another; and a control gate positioned above the trapping layer.

18 Claims, 10 Drawing Sheets

Related U.S. Application Data continuation of application No. 15/480,677, filed on Apr. 6, 2017, now Pat. No. 9,928,910, which is a continuation of application No. 14/978,956, filed on Dec. 22, 2015, now Pat. No. 9,646,693, which is a division of application No. 14/549,322, filed on Nov. 20, 2014, now Pat. No. 9,257,179, which is a division of application No. 13/196,471, filed on Aug. 2, 2011, now Pat. No. 8,923,052, which is a continuation of application No. 12/420,659, filed on Apr. 8, 2009, now Pat. No. 8,014,200.

(60) Provisional application No. 61/043,131, filed on Apr. 8, 2008.

(51) Int. Cl.
*H01L 27/108* (2006.01)
*H01L 29/78* (2006.01)
*G11C 11/56* (2006.01)
*G11C 16/02* (2006.01)
*H01L 29/792* (2006.01)

(52) U.S. Cl.
CPC .......... *G11C 16/02* (2013.01); *G11C 16/0475* (2013.01); *H01L 27/108* (2013.01); *H01L 27/10802* (2013.01); *H01L 29/7841* (2013.01); *H01L 29/792* (2013.01)

(58) Field of Classification Search
CPC .......... H01L 27/01802; H01L 29/7841; H01L 29/792
See application file for complete search history.

(56) References Cited

U.S. PATENT DOCUMENTS

| | | | |
|---|---|---|---|
| 4,385,308 A | 5/1983 | Uchida | |
| 4,388,704 A * | 6/1983 | Bertin | G11C 14/00 257/E27.103 |
| 4,959,812 A | 9/1990 | Momodomi et al. | |
| 5,519,831 A | 5/1996 | Holzhammer | |
| 5,581,504 A | 12/1996 | Chang et al. | |
| 5,767,549 A | 6/1998 | Chen et al. | |
| 5,999,444 A | 12/1999 | Fujiwara et al. | |
| 6,005,818 A | 12/1999 | Ferrant et al. | |
| 6,009,011 A | 12/1999 | Yamauchi | |
| 6,064,100 A | 5/2000 | Wen | |
| 6,141,248 A | 10/2000 | Forbes et al. | |
| 6,163,048 A | 12/2000 | Hirose et al. | |
| 6,166,407 A | 12/2000 | Ohta | |
| 6,341,087 B1 | 1/2002 | Kunikiyo et al. | |
| 6,356,485 B1 | 3/2002 | Proebsting | |
| 6,376,876 B1 | 4/2002 | Shin et al. | |
| 6,542,411 B2 | 4/2003 | Tanikawa et al. | |
| 6,614,684 B1 | 9/2003 | Shukuri et al. | |
| 6,649,972 B2 | 11/2003 | Eitan | |
| 6,661,042 B2 | 12/2003 | Hsu | |
| 6,686,624 B2 | 2/2004 | Hsu | |
| 6,724,657 B2 | 4/2004 | Shukuri et al. | |
| 6,791,882 B2 | 9/2004 | Seki et al. | |
| 6,801,452 B2 | 10/2004 | Miwa et al. | |
| 6,849,501 B2 | 2/2005 | Rudeck | |
| 6,870,751 B2 | 3/2005 | van Brocklin et al. | |
| 6,885,581 B2 | 4/2005 | Nemati et al. | |
| 6,913,964 B2 | 7/2005 | Hsu | |
| 6,925,006 B2 | 8/2005 | Fazan et al. | |
| 6,954,377 B2 | 10/2005 | Choi et al. | |
| 6,969,662 B2 | 11/2005 | Fazan et al. | |
| 7,012,836 B2 | 3/2006 | Matsubara et al. | |
| 7,085,156 B2 | 8/2006 | Ferrant et al. | |
| 7,113,431 B1 | 9/2006 | Hamilton et al. | |
| 7,118,986 B2 | 10/2006 | Steigerwalt et al. | |
| 7,170,807 B2 | 1/2007 | Fazan et al. | |
| 7,224,019 B2 | 5/2007 | Hieda et al. | |
| 7,259,420 B2 | 8/2007 | Anderson et al. | |
| 7,259,992 B2 | 8/2007 | Shirota | |
| 7,285,820 B2 | 10/2007 | Park et al. | |
| 7,301,803 B2 | 11/2007 | Okhonin et al. | |
| 7,329,580 B2 | 2/2008 | Choi et al. | |
| 7,440,333 B2 | 10/2008 | Hsia et al. | |
| 7,447,068 B2 | 11/2008 | Tsai et al. | |
| 7,450,423 B2 | 11/2008 | Lai et al. | |
| 7,473,611 B2 | 1/2009 | Cho et al. | |
| 7,504,302 B2 | 3/2009 | Matthew et al. | |
| 7,541,636 B2 | 6/2009 | Ranica et al. | |
| 7,542,345 B2 | 6/2009 | Okhonin et al. | |
| 7,579,241 B2 | 8/2009 | Hieda et al. | |
| 7,609,551 B2 | 10/2009 | Shino et al. | |
| 7,622,761 B2 | 11/2009 | Park et al. | |
| 7,733,693 B2 | 6/2010 | Ferrant et al. | |
| 7,759,715 B2 | 7/2010 | Bhattacharyya | |
| 7,760,548 B2 | 7/2010 | Widjaja | |
| 7,829,938 B2 | 11/2010 | Bhattacharyya | |
| 7,847,338 B2 | 12/2010 | Widjaja | |
| 7,982,256 B2 | 7/2011 | Huo et al. | |
| 8,014,200 B2 | 9/2011 | Widjaja | |
| 8,036,033 B2 | 10/2011 | Widjaja | |
| 8,059,459 B2 | 11/2011 | Widjaja | |
| 8,130,547 B2 | 3/2012 | Widjaja et al. | |
| 8,130,548 B2 | 3/2012 | Widjaja et al. | |
| 8,159,878 B2 | 4/2012 | Widjaja | |
| 8,174,886 B2 | 5/2012 | Widjaja et al. | |
| 8,194,451 B2 | 6/2012 | Widjaja | |
| 8,208,302 B2 | 6/2012 | Widjaja | |
| 8,294,193 B2 | 10/2012 | Widjaja | |
| 8,391,066 B2 | 3/2013 | Widjaja | |
| 8,472,249 B2 | 6/2013 | Widjaja | |
| 8,514,622 B2 | 8/2013 | Widjaja | |
| 8,514,623 B2 | 8/2013 | Widjaja et al. | |
| 8,531,881 B2 | 9/2013 | Widjaja | |
| 8,570,803 B2 | 10/2013 | Widjaja | |
| 8,654,583 B2 | 2/2014 | Widjaja | |
| 8,711,622 B2 | 4/2014 | Widjaja | |
| 8,787,085 B2 | 7/2014 | Widjaja | |
| 8,923,052 B2 | 12/2014 | Widjaja | |
| 8,937,834 B2 | 1/2015 | Widjaja et al. | |
| 8,995,186 B2 | 3/2015 | Widjaja | |
| 9,001,581 B2 | 4/2015 | Widjaja | |
| 9,153,333 B2 | 10/2015 | Widjaja | |
| 9,257,179 B2 | 2/2016 | Widjaja | |
| 9,460,790 B2 | 10/2016 | Widjaja | |
| 9,646,693 B2 | 5/2017 | Widjaja | |
| 9,716,311 B2 | 7/2017 | Greene et al. | |
| 9,928,910 B2 | 3/2018 | Widjaja | |
| 2002/0018366 A1 | 2/2002 | von Schwerin et al. | |
| 2002/0048193 A1 | 4/2002 | Tanikawa et al. | |
| 2002/0054514 A1 | 5/2002 | Kajigaya et al. | |
| 2003/0168680 A1 | 9/2003 | Hsu | |
| 2004/0104407 A1 | 6/2004 | Hsu et al. | |
| 2004/0228168 A1 | 11/2004 | Ferrant et al. | |
| 2005/0024968 A1 | 2/2005 | Lee et al. | |
| 2005/0032313 A1 | 2/2005 | Forbes | |
| 2005/0124120 A1 | 6/2005 | Du et al. | |
| 2006/0044915 A1 | 3/2006 | Park et al. | |
| 2006/0046408 A1 | 3/2006 | Ohsawa | |
| 2006/0056234 A1 | 3/2006 | Lowrey | |
| 2006/0125010 A1 | 6/2006 | Bhattacharyya | |
| 2006/0146606 A1 | 7/2006 | Bhattacharyya et al. | |
| 2006/0157679 A1 | 7/2006 | Scheuerlein | |
| 2006/0193174 A1 | 8/2006 | Choi et al. | |
| 2006/0227601 A1 | 10/2006 | Bhattacharyya | |
| 2006/0237770 A1 | 10/2006 | Huang | |
| 2006/0278915 A1 | 12/2006 | Lee et al. | |
| 2007/0004149 A1 | 1/2007 | Tews | |
| 2007/0090443 A1 | 4/2007 | Choi et al. | |
| 2007/0164351 A1 | 7/2007 | Hamamoto | |
| 2007/0164352 A1 | 7/2007 | Padilla | |
| 2007/0210338 A1 | 9/2007 | Orlowski | |
| 2007/0215954 A1 | 9/2007 | Mouli | |
| 2007/0284648 A1 | 12/2007 | Park et al. | |
| 2008/0048239 A1 | 2/2008 | Huo et al. | |
| 2008/0080248 A1 | 4/2008 | Lue et al. | |

(56) References Cited

U.S. PATENT DOCUMENTS

| | | |
|---|---|---|
| 2008/0111154 A1 | 5/2008 | Voldman |
| 2008/0123418 A1 | 5/2008 | Widjaja |
| 2008/0224202 A1 | 9/2008 | Young et al. |
| 2008/0265305 A1 | 10/2008 | He et al. |
| 2008/0303079 A1 | 12/2008 | Cho et al. |
| 2009/0020754 A1 | 1/2009 | Suryagandh et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0173983 A1 | 7/2009 | Kusunoki et al. |
| 2009/0173985 A1 | 7/2009 | Lee et al. |
| 2009/0190402 A1 | 7/2009 | Hsu et al. |
| 2009/0230447 A1 | 9/2009 | Hwang |
| 2009/0242996 A1 | 10/2009 | van Bentrum et al. |
| 2009/0316492 A1 | 12/2009 | Widjaja |
| 2010/0246277 A1 | 9/2010 | Widjaja |
| 2010/0246284 A1 | 9/2010 | Widjaja et al. |
| 2011/0032756 A1 | 2/2011 | Widjaja |
| 2011/0042736 A1 | 2/2011 | Widjaja |
| 2011/0044110 A1 | 2/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0230123 A1 | 9/2012 | Widjaja et al. |
| 2013/0148422 A1 | 6/2013 | Widjaja |
| 2013/0250685 A1 | 9/2013 | Widjaja |
| 2013/0292635 A1 | 11/2013 | Widjaja |
| 2014/0160868 A1 | 6/2014 | Widjaja et al. |
| 2014/0355343 A1 | 12/2014 | Widjaja |
| 2015/0109860 A1 | 4/2015 | Widjaja |
| 2015/0371707 A1 | 12/2015 | Widjaja |
| 2016/0111158 A1 | 4/2016 | Widjaja |
| 2017/0025534 A1 | 1/2017 | Widjaja |
| 2017/0213593 A1 | 7/2017 | Widjaja |
| 2017/0365340 A1 | 12/2017 | Widjaja |
| 2018/0174654 A1 | 6/2018 | Widjaja |

OTHER PUBLICATIONS

Chatterjee, et al. Circuit Optimization of the Paper Isolated Dynamic Gain RAM Cell for VLSI Memories, pp. 22-23, 1979.
Chatterjee, et al. "a survey of high-density dynamic RAM cell concepts." Electron Devices, IEEE Transactions on 26.6 (1979): 827-839.
Erb, D. "Stratified charge memory." Solid-State Circuits Conference. Digest of Technical Papers. 1978 IEEE International. vol. 21 IEEE, 1978, pp. 24-25.
Leiss, et al, "dRAM Design Using the Taper-Isolated Dynamic RAM Cell." Solid-State Circuits, IEEE Journal of 17.2 (1982): 337-344.
Lin, et al., A new 1T DRAM Cell with enhanced Floating Body Effect, pp. 1-5, Proceeding of the 2006 IEEE International Workshop on Memory Technology.
Lanyon, et al., "Bandgap Narrowing in Moderately to Heavily Doped Silicon", ppl 1014-1018, No. 7, vol. ED-26, IEEE, 1979.
Ohsawa, et al. Autonomous refresh of floating body cell (FBC), IEEE 2008, pp. 801-804.
Oh, et al., A 4-Bit Double SONOS memory (DSM) with 4 Storage Nodes Per Cell for Ultimate Multi-Bit Operation, pp. 1-2, 2006, Symposium on VLSI Technology Digest of Technical Papers.
Ranica, et al. "A one transistor cell on bulk substrate (1T-Bulk) for low-cost and high density eDRAM." VLSI Technology, 2004. Digest of Technical Papers. 2004 Symposium on. IEEE, 2004, pp. 128-129.
Reisch, "On bistable behavior and open-base breakdown of bipolar transistors in the avalanche regime-modeling and applications." Electron Devices IEEE Transactions on 39.6 (1992): 1398-1409.
Sakui, K., et al. "A new static memory cell based on the reverse base current effect of bipolar transistors." Electron Devices, IEEE Transactions on 36.6 (1989): 1215-1217.
Sakui, Koji, et al. "A new static memory cell based on reverse base current (RBC) effect of bipolar transistor." Electron Devices Meeting, 1988. IEDM'88. Technical Digest., International. IEEE, 1988, pp. 44-47.
Sze, et al. Physics of Semiconductor Devices, Wiley-Interscience, 2007, pp. 104.
Terada, et al. "A new VLSI memory cell using capacitance coupling (CC cell)." Electron Devices, IEEE Transactions on 31.9 (1984): pp. 1319-1324.
Villaret, et al. "Further insight into the physics and modeling of floating-body capacitorless DRAMs." Electron Devices, IEEE Transactions on 52.11 (2005): pp. 2447-2454.
Campardo, G. et al., VLSI Design of Non-Volatile Memories, Springer Berlin Heidelberg New York, 2005, pp. 94-95.
Han et al., Programming/Erasing Characteristics of 45 nm NOR-Type Flash Memory Based on SOI FinFET Structure. J. Korean Physical Society, vol. 47, Nov. 2005, pp. S564-S567.
Headland, Hot electron injection, Feb. 19, 2004, pp. 1-2.
Ohsawa et al., Memory Design Using One-Transistor Gain Cell on SOI, Tech.. Digest IEEE International Solid-State4 Circuits, vol. 37, No. 11, 2002, pp. 1510-1522.
Ohsawa et al., An 18.5ns, 128Mb SOI DRAM with a Floating Body Cell, IEEE International Solid-State Circuits Conference, 2005, pp. 458-459, 609.
Okhonin et al., A Capacitor-less 1T-DRAM Cell, IEEE Electron Device Letters, vol. 23, No. 2, Feb. 2002, pp. 85-87.
Okhonin et al., A SOI Capacitor-less 1T-DRAM Concept, IEEE International SOI Conference, 2001, pp. 153-154.
Okhonin et al., Principles of Transient Charge Pumping on Partially Depleted SOI MOSFETs, IEEE Electron Device Letters, vol. 23, No. 5, May 2002, pp. 279-281.
Pellizzer et al, A 90nm Phase Change Memory Technology fro Stand-Alone Non-Volatile Memory Applications, 2006 Symposium on VLSI Tech. Digest of Tech. Papers, pp. 1-2, 2006.
Ranica et al., Scaled 1T-Bulk devices built with CMOS 90nm technology for low-cost eDRAM applications, 2005 Symposium on VLSI Tech. Digest of Tech. Papers, pp. 38-39, 2005.
Pierret, Semiconductor Device Fundamentals, ISBN: 0-201-54393-1, Addison-Wesley Publishing Co., Inc., PNPN Devices 463-476, 1996.
Tack et al., The Multistable Charge-Controlled Memory Effect in SOI Transistors at Low Temperatures, IEEE Transactions on Electron Devices, vol. 37, May 1990, pp. 1373-1382.
Yoshida et al., A Design of Capacitorless 1T-DRAM Cell Using Gate-Induced Drain Leakage (GIDL) Current for Low-power and High-speed Embedded Memory, International Electron Device Meeting, 2003, pp. 1-4.
Ohsawa, et al. "Autonomous refresh of floating body cell (FBC)." Electron Devices Meeting, 2008. IEDM 2008. IEEE International IEEE, 2008.
Ban et al., A Scaled Floating Body Cell (FBC) Memory with High-k+Metal Gate on Thin-Silicon and Thin-BOX for 16-nm Technology Node and Beyond, Symposium on VLSI Technology, 2008, pp. 92-93.

\* cited by examiner

SEMICONDUCTOR MEMORY HAVING VOLATILE AND MULTI-BIT NON-VOLATILE FUNCTIONALITY AND METHOD OF OPERATING

CROSS-REFERENCE

This application is a continuation of co-pending application Ser. No. 15/893,625, filed on Feb. 10, 2018, which is a continuation of application Ser. No. 15/480,677, filed on Apr. 6, 2017, now U.S. Pat. No. 9,928,910, which issued on Mar. 27, 2018, which is a continuation of application Ser. No. 14/978,956, filed on Dec. 22, 2015, now U.S. Pat. No. 9,646,693, which issued on May 9, 2017, which is a division of application Ser. No. 14/549,322, filed on Nov. 20, 2014, now U.S. Pat. No. 9,257,179 which issued on Feb. 9, 2016, which is a division of application Ser. No. 13/196,471, filed Aug. 2, 2011, non U.S. Pat. No. 8,923,052 which issued on Dec. 30, 2014, which is a continuation of application Ser. No. 12/420,659 filed on Apr. 8, 2009, now U.S. Pat. No. 8,014,200, which issued on Sep. 6, 2011 and which claims the benefit of U.S. Provisional Application No. 61/043,131, filed Apr. 8, 2008, all of which applications and patents are hereby incorporated herein, in their entireties, by reference thereto, and to which applications we claim priority under 35U.S.C. Sections 119 and 120.

FIELD OF THE INVENTION

The present inventions relates to semiconductor memory technology. More specifically, the present invention relates to semiconductor memory having both volatile and non-volatile semiconductor memory features.

BACKGROUND OF THE INVENTION

Semiconductor memory devices are used extensively to store data. Memory devices can be characterized according to two general types: volatile and non-volatile. Volatile memory devices such as static random access memory (SRAM) and dynamic random access memory (DRAM) lose data that is stored therein when power is not continuously supplied thereto.

Non-volatile memory devices, such as flash erasable programmable read only memory (Flash EPROM) devices, retain stored data even in the absence of power supplied thereto. Unfortunately, non-volatile memory devices typically operate more slowly than volatile memory devices. Accordingly, it would be desirable to provide a universal type memory device that includes the advantages of both volatile and non-volatile memory devices, i.e., fast operation on par with volatile memories, while having the ability to retain stored data when power is discontinued to the memory device. It would further be desirable to provide such a universal type memory device having a size that is not prohibitively larger than comparable volatile or non-volatile devices and which has comparable storage capacity to the same.

SUMMARY OF THE INVENTION

The present invention provides semiconductor memory having both volatile and non-volatile modes and methods of operation of the same.

In at least one embodiment, a semiconductor memory cell according to the present invention includes: a substrate having a first conductivity type; a first region embedded in the substrate at a first location of the substrate and having a second conductivity type; a second region embedded in the substrate at a second location of the substrate and have the second conductivity type, such that at least a portion of the substrate having the first conductivity type is located between the first and second locations and functions as a floating body to store data in volatile memory; a trapping layer positioned in between the first and second locations and above a surface of the substrate; the trapping layer comprising first and second storage locations being configured to store data as nonvolatile memory independently of one another; and a control gate positioned above the trapping layer.

In at least one embodiment, the first and second storage locations are each configured to receive transfer of data stored by the volatile memory and store the data as nonvolatile memory in the trapping layer.

In at least one embodiment, only one of the first and second storage locations is configured to receive transfer of data stored by the volatile memory upon interruption of power to the memory cell.

In at least one embodiment, the surface of the substrate comprises a top surface, the cell further comprising a buried layer at a bottom portion of the substrate, the buried layer having the second conductivity type.

In at least one embodiment, the floating body is completely bounded by the top surface, the first and second regions and the buried layer.

In at least one embodiment, the first conductivity type is "p" type and the second conductivity type is "n" type.

In at least one embodiment, insulating layers bound the side surfaces of the substrate.

In at least one embodiment, the cell is configured for use as non-volatile memory with fast read/write speed, and the volatile memory is used as a write buffer.

In at least one embodiment, the cell is configured so that one of the first and second storage locations interacts with the floating body so that the memory cell provides both volatile and non-volatile memory functionality, and the other of the first and second storage locations is configured to store non-volatile data that is not used as volatile memory by the floating body.

In at least one embodiment, the cell functions as a multi-level cell.

In at least one embodiment, at least one of the first and second storage locations is configured so that more than one bit of data can be stored in the at least one of the first and second storage locations, respectively.

A method of operating a memory cell device having a plurality of memory cells each having a floating body for storing, reading and writing data as volatile memory, and a trapping layer having first and second storage locations for storing data as non-volatile memory is provided, wherein the method includes: writing data to the floating body of a memory cell of the device; writing additional data to the floating body of another memory cell of the device, while at the same time commencing writing data from the floating body of the previous memory cell to non-volatile storage of that cell; and continuing to write additional data to the floating bodies of more memory cells of the device, as volatile memory, while at the same time, writing volatile memory from cells in which data has already been written to the floating bodies thereof, to non-volatile memory in a mass parallel, non-algorithmic process.

In at least one embodiment, the cells are arranged in rows and columns, and wherein, after a segment of the memory array (for example, an entire row of cells) have stored a bit of volatile data, each in the floating body of each cell, respectively, and after the volatile data has been written to the nonvolatile storage by storing in one of two storage locations provided in a trapping layer of each the cell, respectively, the method further comprising repeating the steps of the method described in the preceding paragraph, but wherein the writing of data from the floating bodies to the non-volatile memory comprises storing the data in the second location of the trapping layer of the cell, respectively for the plurality of cells.

A method of operating a memory cell having a floating body for storing, reading and writing data as volatile memory, and a trapping layer comprising two storage locations for storing data as non-volatile memory is provided, wherein the method includes: storing permanent data in one of the two storage locations in the trapping layer; storing additional data to the floating body while power is applied to the memory cell; transferring the additional data stored in the floating body to the other of the two storage locations of the trapping layer when power to the cell is interrupted; and storing the additional data in the other of the two storage locations of the trapping layer as non-volatile memory.

In at least one embodiment, the additional data stored in the floating body is stored as volatile memory.

In at least one embodiment, the method further includes transferring the additional data stored in the other of the two storage locations of the trapping layer to the floating body when power is restored to the cell; and storing the data in the floating body as volatile memory; wherein the permanent data stored in the one of the two storage locations in the trapping layer remains unchanged when power to the cell is interrupted and when power is restored to the cell.

In at least one embodiment, the additional data transferred is stored in the other of the two storage locations of the trapping layer with a charge that is complementary to a charge of the floating body when storing the additional data.

In at least one embodiment, the transferring is a non-algorithmic process.

In at least one embodiment, the method is carried out on a plurality of the cells in a memory cell device, wherein the transferring is a parallel, non-algorithmic process.

In at least one embodiment, the method further includes restoring the other of the two storage locations of the trapping layer to a predetermined charge state, while leaving a state of the one of the two storage locations of the trapping layer unchanged.

In at least one embodiment, the method includes writing a predetermined state to the floating body prior to the transferring the additional data stored in the other of the two storage locations of the trapping layer to the floating body.

These and other features of the invention will become apparent to those persons skilled in the art upon reading the details of the memory cells, devices and methods as more fully described below.

DETAILED DESCRIPTION OF THE INVENTION

Figure 1:
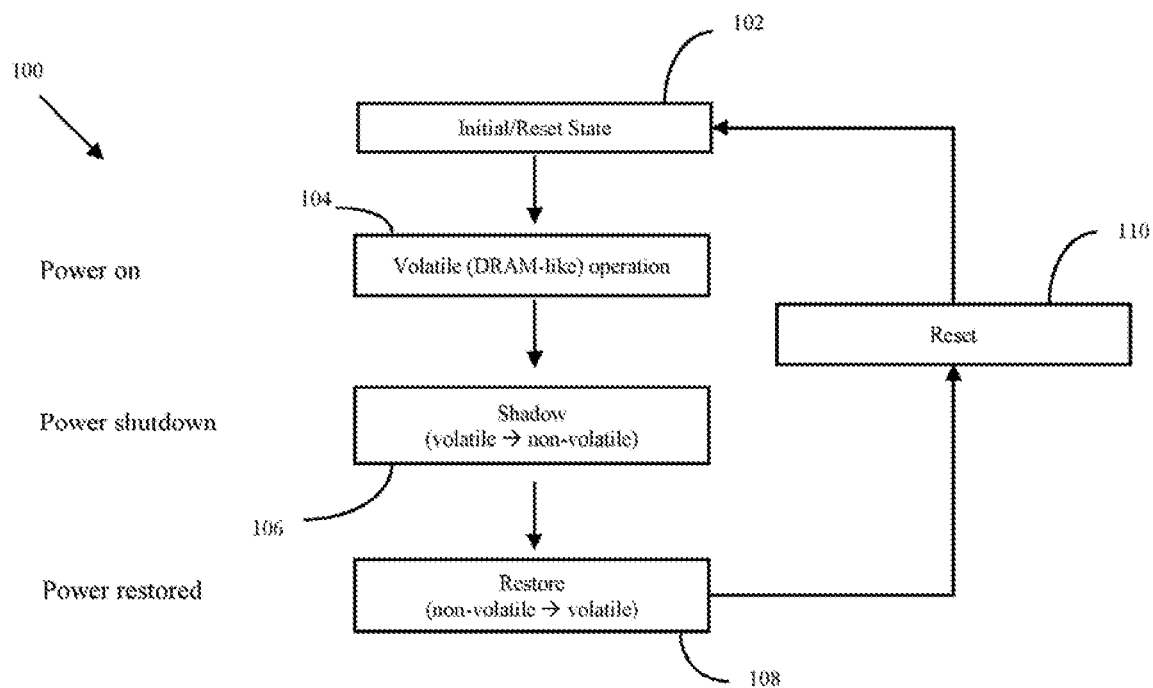
FIG. 1 is a flowchart illustrating operation of a memory cell of a memory device according to the present invention.

Before the present devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the transistor" includes reference to one or more transistors and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The terms "shadowing" "shadowing operation" and "shadowing process" refer to a process of copying the contents of volatile memory to non-volatile memory.

"Restore", "restore operation", or "restore process", as used herein, refers to a process of copying the contents of non-volatile memory to volatile memory.

"Reset", "reset operation", or "reset process", as used herein, refers to a process of setting non-volatile memory to a predetermined state following a restore process, or when otherwise setting the non-volatile memory to an initial state (such as when powering up for the first time, prior to ever storing data in the non-volatile memory, for example).

"Permanent data" as used herein, is referred to data that typically will not be changed during the operation of a system employing a memory cell device as described herein, and thus can be stored indefinitely in non-volatile memory. Examples of such "permanent data" include, but are not limited to program files, application files, music files, video files, operating systems, etc.

Devices and Methods

FIG. 1 is a flowchart 100 illustrating operation of a memory device according to the present invention. At event 102, when power is first applied to the memory device, the memory device is placed in an initial state, in a volatile operational mode and the nonvolatile memory is set to a predetermined state, typically set to have a positive charge. At event 104, while power is still on, the memory device of the present invention operates in the same manner as a conventional DRAM (dynamic random access memory) memory cell, i.e., operating as volatile memory. However, during power shutdown, or when power is inadvertently lost, or any other event that discontinues or upsets power to the memory device of the present invention, the content of the volatile memory is loaded into non-volatile memory at event 106, during a process which is referred to here as "shadowing" (event 106), and the data held in volatile memory is lost. Shadowing can also be performed during backup operations, which may be performed at regular intervals during DRAM operation 104 periods, and/or at any time that a user manually instructs a backup. During a backup operation, the content of the volatile memory is copied to the non-volatile memory while power is maintained to the volatile memory so that the content of the volatile memory also remains in volatile memory. Alternatively, because the volatile memory operation consumes more power than the non-volatile storage of the contents of the volatile memory, the device can be configured to perform the shadowing process anytime the device has been idle for at least a predetermined period of time, thereby transferring the contents of the volatile memory into non-volatile memory and conserving power. As one example, the predetermined time period can be about thirty minutes, but of course, the invention is not limited to this time period, as the device could be programmed with virtually any predetermined time period.

After the content of the volatile memory has been moved during a shadowing operation to nonvolatile memory, the shutdown of the memory device occurs, as power is no longer supplied to the volatile memory. At this time, the memory device functions like a Flash EPROM (erasable, programmable read-only memory) device in that it retains the stored data in the nonvolatile memory. Upon restoring power at event 108, the content of the nonvolatile memory is restored by transferring the content of the non-volatile memory to the volatile memory in a process referred to herein as the "restore" process, after which, upon resetting the memory device at event 110, the memory device is again set to the initial state 102 and again operates in a volatile mode, like a DRAM memory device, event 104.

The present invention thus provides a memory device which combines the fast operation of volatile memories with the ability to retain charge that is provided in nonvolatile memories. Further, the data transfer from the volatile mode to the non-volatile mode and vice versa, operate in parallel by a non-algorithmic process described below, which greatly enhances the speed of operation of the storage device. As one non-limiting practical application of use of a memory device according to the present invention, a description of operation of the memory device in a personal computer follows. This example is in no way intended to limit the applications in which the present invention may be used, as there are many applications, including, but not limited to: cell phones, laptop computers, desktop computers, kitchen appliances, land line phones, electronic gaming, video games, personal organizers, mp3 and other electronic forms of digital music players, and any other applications, too numerous to mention here, that use digital memory. In use, the volatile mode provides a fast access speed and is what is used during normal operations (i.e., when the power is on to the memory device). In an example of use in a personal computer (PC), when the power to the PC is on (i.e., the PC is turned on), the memory device according to the present invention operates in volatile mode. When the PC is shut down (i.e., power is turned off), the memory content of the volatile memory is shadowed to the non-volatile memory of the memory device according to the present invention. When the PC is turned on again (power is turned on), the memory content is restored from the non-volatile memory to the volatile memory. A reset process is then conducted on the non-volatile memory so that its data does not interfere with the data having been transferred to the volatile memory.

Figure 2:
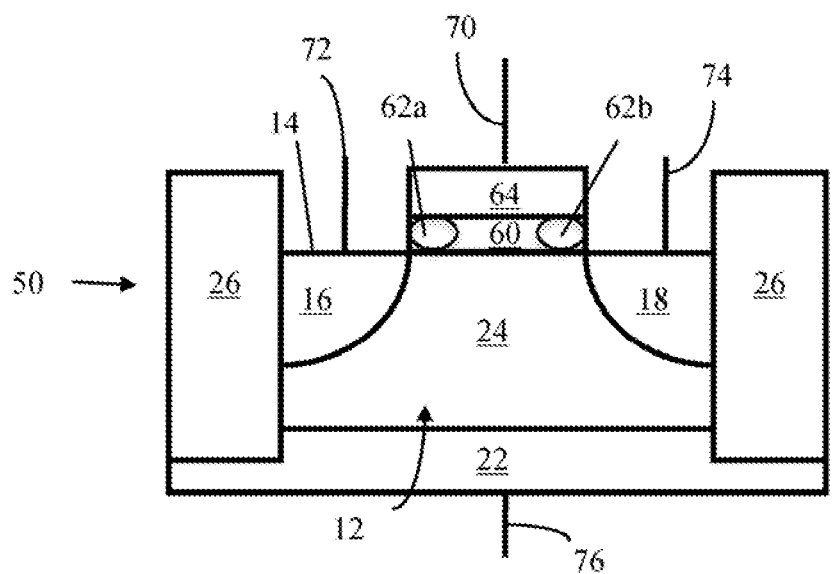
FIG. 2 is a schematic, cross-sectional view of an embodiment of a memory cell according to the present invention.

FIG. 2 schematically illustrates an embodiment of a memory cell 50 according to the present invention. The cell 50 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and which is exposed at surface 14. A second region 18 having the second conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art.

A buried layer 22 of the second conductivity type is also provided in the substrate 12, buried in the substrate 12, as shown. Region 22 can also be formed by an ion implantation process on the material of substrate 12. A body region 24 of the substrate 12 is bounded by surface 14, first and second regions 16,18 and insulating layers 26 (e.g. shallow trench isolation (STI)), which may be made of silicon oxide, for example. Insulating layers 26 insulate cell 50 from neighboring cells 50 when multiple cells 50 are joined to make a memory device. A trapping layer 60 is positioned in between the regions 16 and 18, and above the surface 14. Trapping layer 60 may be made of silicon nitride, silicon nanocrystal or high-K dielectric materials or other dielectric materials. Trapping layer 60 is an insulator layer and functions to store non-volatile memory data. Trapping layer 60 may have two physically separated storage locations 62a, 62b, so that each cell 50 provides multi-bit, non-volatile storing functionality.

A control gate 64 is positioned above trapping layer 60 such that trapping layer 60 is positioned between control gate 64 and surface 14, as shown in FIG. 2. Control gate 64 is typically made of polysilicon material or metal gate electrode, such as tungsten, tantalum, titanium and/or their nitrides. The trapping layer 60 functions to store non-volatile memory data and the control gate 64 is used for memory cell selection (e.g., control gate 64 connected to word line 70 which can be used to selected rows).

Cell 50 includes four terminals: word line (WL) terminal 70, bit line (BL) terminals 72 and 74 and buried well (BW) terminal 76. Terminal 70 is connected to control gate 64. Terminal 72 is connected to first region 16 and terminal 74 is connected to second region 18. Alternatively, terminal 72 can be connected to second region 18 and terminal 74 can be connected to first region 16. Terminal 76 is connected to buried layer 22.

Figure 3:
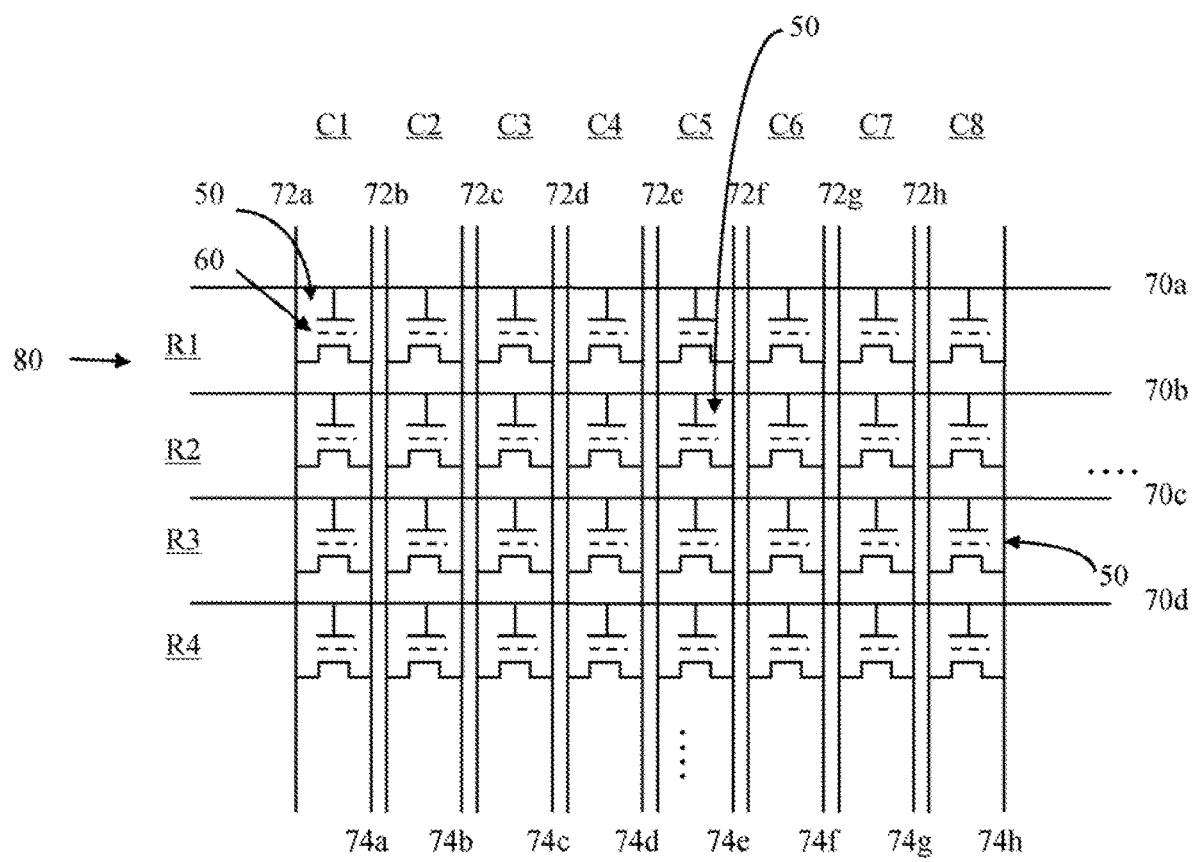
FIG. 3 is a schematic diagram showing an example of array architecture of a memory cell device according to an embodiment of the present invention.

FIG. 3 shows an example of an array architecture 80 of a memory cell device according to the present invention, wherein memory cells 50 are arranged in a plurality of rows and columns. Alternatively, a memory cell device according to the present invention may be provided in a single row or column of a plurality of cells 50, but typically both a plurality of rows and a plurality of columns are provided. Memory cells 50 are connected such that within each row, all of the control gates 64 are connected in common word line terminals 70 (i.e., 70a, 70b . . . , etc.). Within each column, all first and second regions 16, 18 of cells 50 in that column are connected in common bit line terminals 72 (i.e., 72a, 72b . . . , etc.) and 74 (i.e., 74a, 74b . . . , etc.).

Figure 4:
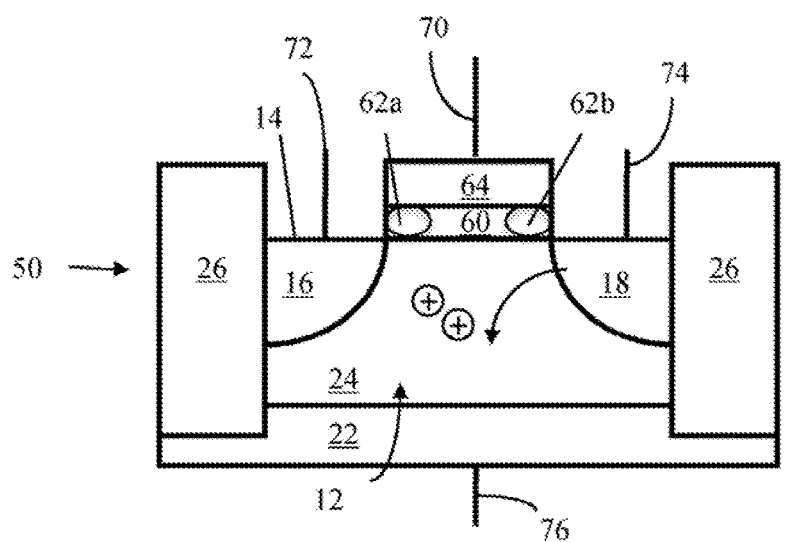
FIG. 4 illustrates an operating condition for the write state "1" operation that can be carried out on a memory cell according to the present invention.

FIG. 4 illustrates alternative write state "1" operations that can be carried out on cell 50, by performing band-to-band tunneling hot hole injection or, alternatively, impact ionization hot hole injection. In further alternative embodiments, electrons can be transferred, rather than holes by reversing every designated "p" and "n" region to "n" and "p" regions, respectively. As an example of performing a write state "1" into the floating body region 24 using a band-to-band tunneling mechanism, a positive voltage is applied to BL2 terminal 74, a neutral or positive voltage less than the positive voltage applied to BL2 terminal 74 is applied to BL1 terminal 72, a negative voltage is applied to WL terminal 70 and a positive voltage less than the positive voltage applied to the BL2 terminal 74 is applied to BW terminal 76. Under these conditions, holes are injected from BL2 terminal 74 into the floating body region 24, leaving the body region 24 positively charged. The positive voltages applied to the BL1 and BL2 terminals 72, 74 create depletion regions that shield the effects of any charges that are stored in trapping layer 60.

In one particular non-limiting embodiment, a charge of about +0.4 volts is applied to terminal 72, a charge of about +2.0 volts is applied to terminal 74, a charge of about −1.2 volts is applied to terminal 70, and a charge of about +0.6 volts is applied to terminal 76. However, these voltage levels may vary, while maintaining the relative relationships (e.g., more positive than another terminal, less positive than another terminal, etc.) between the voltages applied, as described above. For example, voltage applied to terminal 72 may be in the range of about +0.1 volts to about +0.6 volts, voltage applied to terminal 74 may be in the range of about +1.2 volts to about +3.0 volts, voltage applied to terminal 70 may be in the range of about 0.0 volts to about −3.0 volts, and voltage applied to terminal 76 may be in the range of about 0.0 volts to about +1.0 volts. Further, the voltages applied to terminals 72 and 74 may be reversed, and still obtain the same storage result of one volatile bit of data stored.

Alternatively, to write a state "1" using the impact ionization hot hole injection mechanism, a positive voltage is applied to BL2 terminal 74, a neutral or positive voltage less than the positive voltage applied to terminal 74 is applied to BL1 terminal 72, a positive voltage is applied to WL terminal 70 and a positive voltage less than the positive voltage applied to terminal 74 is applied to BW terminal 76. Under these conditions, holes are injected from BL2 terminal 74 into the floating body region 24, leaving the body region 24 positively charged. The positive voltages applied to terminals 72 and 74 create depletion regions that shield the effects of any charges that are stored in trapping layer 60. Voltage on terminal 74 is more positive (i.e., higher positive voltage) than that on terminal 72. This condition results in impact ionization, creating holes injected into the substrate.

In one particular non-limiting embodiment, a charge of about +0.4 volts is applied to terminal 72, a charge of about +2.0 volts is applied to terminal 74, a charge of about +1.2 volts is applied to terminal 70, and a charge of about +0.6 volts is applied to terminal 76. However, these voltage levels may vary, while maintaining the relative relationships between the voltages applied, as described above. For example, voltage applied to terminal 72 may be in the range of about +0.1 volts to about +0.6 volts, voltage applied to terminal 74 may be in the range of about +1.2 volts to about +3.0 volts, voltage applied to terminal 70 may be in the range of about 0.0 volts to about +1.6 volts, and voltage applied to terminal 76 may be in the range of about 0.0 volts to about +1.0 volts. Further, the voltages applied to terminals 72 and 74 may be reversed, and still obtain the same result.

Figure 5:
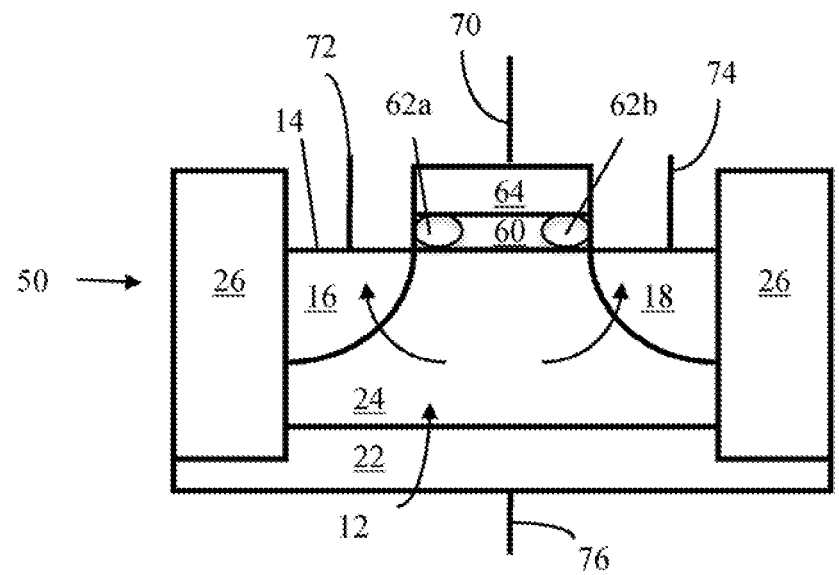
FIG. 5 illustrates an operating condition for the write state "0" operation that can be carried out on a memory cell according to the present invention.

FIG. 5 illustrates a write state "0" operation that can be carried out on cell 50. To write a state "0" into floating body region 24, a negative voltage is applied to BL1 terminal 72, a substantially neutral or a negative voltage equal to the negative voltage applied to BL1 terminal 72 is applied to BL2 terminal 74, a negative voltage less negative than the negative voltage applied to terminal 72 is applied to WL terminal 70 and a positive voltage is applied to BW terminal 76. Under these conditions, the p-n junction (junction between 24 and 16 and between 24 and 18) is forward-biased, evacuating any holes from the floating body 24. In one particular non-limiting embodiment, about −2.0 volts is applied to terminal 72, about −2.0 volts is applied to terminal 74, about −1.2 volts is applied to terminal 70, and about +0.6 volts is applied to terminal 76. However, these voltage levels may vary, while maintaining the relative relationships between the voltages applied, as described above. For example, voltage applied to terminal 72 may be in the range of about −1.0 volts to about −3.0 volts, voltage applied to terminal 74 may be in the range of about 0.0 volts to about −3.0 volts, voltage applied to terminal 70 may be in the range of about 0.0 volts to about −3.0 volts, and voltage applied to terminal 76 may be in the range of about 0.0 volts to about +1.0 volts.

Figure 6:
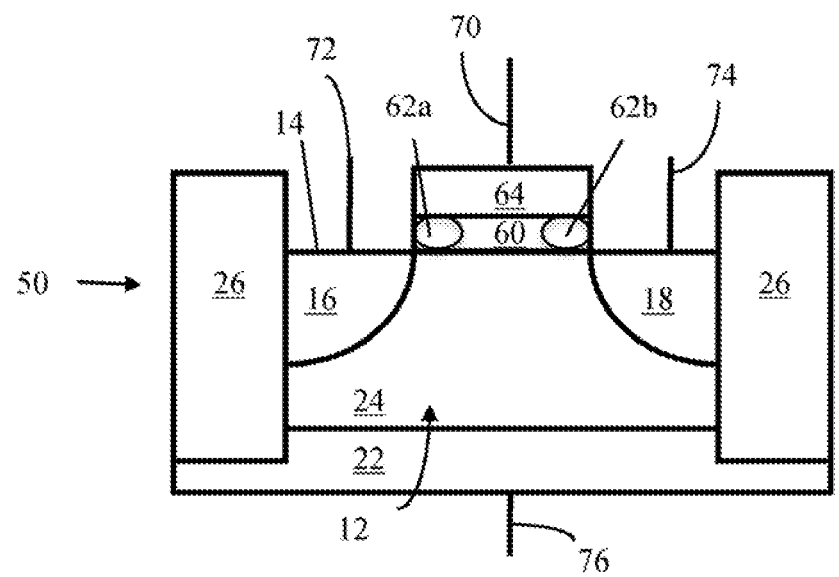
FIG. 6 illustrates a read operation that can be carried out on a memory cell according to the present invention.

A read operation of the cell 50 is now described with reference to FIG. 6. To read cell 50, a substantially neutral charge is applied to BL1 terminal 72, a positive voltage is applied to BL2 terminal 74, a positive voltage that is more positive than the positive voltage applied to terminal 74 is applied to WL terminal 70 and a positive voltage that is less than the positive voltage applied to terminal 70 is applied to BW terminal 76. If cell 50 is in a state "1" having holes in the body region 24, then a lower threshold voltage (gate voltage where the transistor is turned on) is observed compared to the threshold voltage observed when cell 50 is in a state "0" having no holes in body region 24. In one particular non-limiting embodiment, about 0.0 volts is applied to terminal 72, about +0.4 volts is applied to terminal 74, about +1.2 volts is applied to terminal 70, and about +0.6 volts is applied to terminal 76. However, these voltage levels may vary, while maintaining the relative relationships between the voltages applied, as described above. For example, terminal 72 is grounded and is thus at about 0.0 volts, voltage applied to terminal 74 may be in the range of about +0.1 volts to about +1.0 volts, voltage applied to terminal 70 may be in the range of about +1.0 volts to about +3.0 volts, and voltage applied to terminal 76 may be in the range of about 0.0 volts to about +1.0 volts.

Figure 7A:
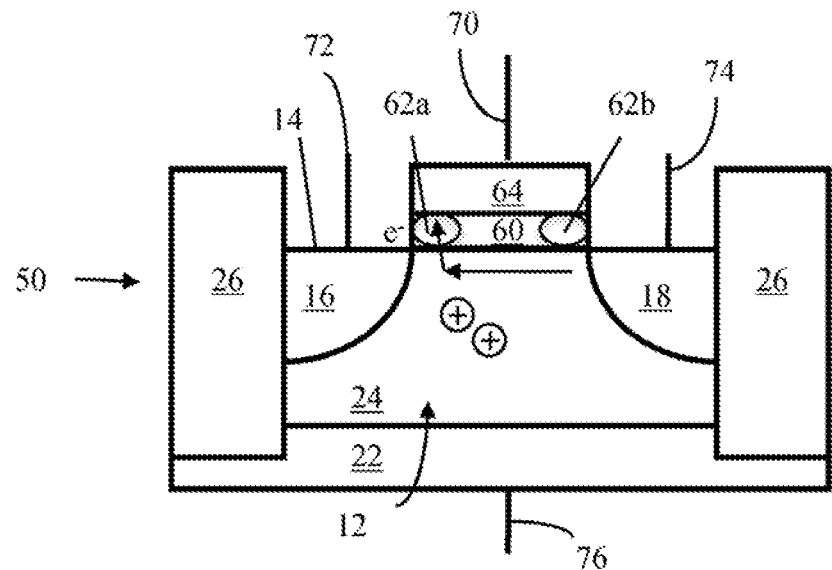
FIGS. 7A and 7B illustrate shadowing operations according to the present invention.

When power down is detected, e.g., when a user turns off the power to cell 50, or the power is inadvertently interrupted, or for any other reason, power is at least temporarily discontinued to cell 50, or due to any specific commands by the user such as during a backup operation, data stored in the floating body region 24 is transferred to trapping layer 60 through a hot electron injection mechanism. This operation is referred to as "shadowing" and is described with reference to FIG. 7. The shadowing process can be performed to store data in the floating body region 24 to either storage location 62a or storage location 62b. To perform a shadowing operation to the storage location 62a, a high positive voltage is applied to BL1 terminal 72 and a neutral or positive voltage less positive than the positive voltage applied to terminal 72 is applied to BL2 terminal 74. A positive voltage is applied to terminal 70 and a positive voltage lower than that applied to terminal 70 is applied to terminal 76. Reference to a "high positive voltage" in this instance means a voltage greater than or equal to about +3 volts. In one example, a voltage in the range of about +3 to about +6 volts is applied as a "high positive voltage", although it is possible to apply a higher voltage. When floating body 24 has a positive charge/voltage, the NPN bipolar junction formed by source drain application of the high voltage to terminal 72 energizes/accelerates electrons traveling through the floating body 24 to a sufficient extent where they can "jump into" storage location 62a, see FIG. 7A. Accordingly, the storage location 62a in the trapping layer 60 becomes negatively charged by the shadowing process, when the volatile memory of cell 50 is in state "1" (i.e., floating body 24 is positively charged), as shown in FIG. 7A.

In one particular non-limiting embodiment, a voltage of about +6.0 volts is applied to terminal 72, a voltage of about +0.4 volts is applied to terminal 74, a voltage of about +1.2 volts is applied to terminal 70, and a voltage of about +0.6 volts is applied to terminal 76. However, these voltage levels may vary, while maintaining the relative relationships between the voltages applied, as described above. For example, voltage applied to terminal 72 may be in the range of about +3.0 volts to about +6.0 volts, voltage applied to terminal 74 may be in the range of about 0.0 volts to about +1.0 volts, voltage applied to terminal 70 may be in the range of about +0.8 volts to about +2.0 volts, and voltage applied to terminal 76 may be in the range of about 0.0 volts to about +1.0 volts.

Figure 7B:
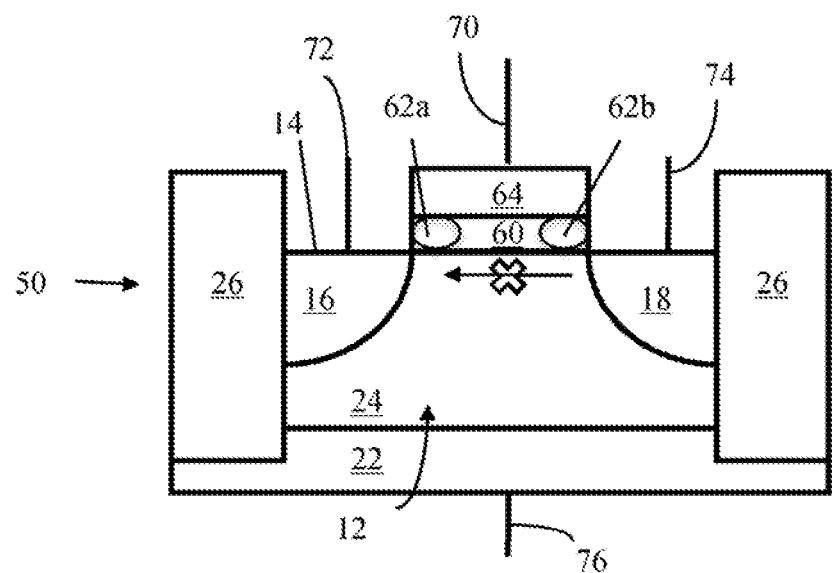

When the volatile memory of cell 50 is in state "0", i.e., when floating body 24 has a negative or neutral charge/voltage, the n-p-n junction is off and electrons do not flow in the floating body 24, as illustrated in FIG. 7B. Accordingly, when voltages are applied to the terminals as described above, in order to perform the shadowing process, the high positive voltage applied to terminal 72 does not cause an acceleration of electrons in order to cause hot electron injection into trapping layer 60, since electrons are not flowing in this instance. Accordingly, no charge injection occurs to the trapping layer 60 and it retains its charge at the end of the shadowing process, when the volatile memory of cell 50 is in state "0" (i.e., floating body 24 is neutral or negatively charged), as shown in FIG. 7B. As will be described in the description of the reset operation, the storage locations 62a, 62b in trapping layer 60 are initialized or reset to have a positive charge. As a result, if the volatile memory of cell 50 is in state "0", the storage location 62a will have a positive charge at the end of the shadowing process.

It is noted that the charge state of the storage location 62a is complementary to the charge state of the floating body 24 after completion of the shadowing process. Thus, if the floating body 24 of the memory cell 50 has a positive charge in volatile memory, the trapping layer 60 will become more negatively charged by the shadowing process, whereas if the floating body of the memory cell 50 has a negative or neutral charge in volatile memory, the storage location 62a will be positively charge at the end of the shadowing operation.

The charge/state of the storage location 62a near BL1 terminal 72 is determined non-algorithmically by the state of the floating body 24. That is, since the state of the floating body does not have to be read, interpreted, or otherwise measured to determine what state to make storage location 62a of trapping layer 60 during shadowing, but rather, the shadowing process occurs automatically, driven by electrical potential differences, the shadowing process is very fast. Further, when shadowing of multiple cells 50 is performed, the process is performed in parallel, thereby maintaining a very fast process speed.

A shadowing operation to storage location 62b near BL2 terminal 74 can be independently performed, in a similar manner to that described for performing a shadowing operation to storage location 62a. The shadowing operation to storage location 62b can be performed by reversing the voltages applied to terminals 72 and 74 for the shadowing operation to storage location 62a.

When power is restored to cell 50, the state of the cell 50 as stored on trapping layer 60 is restored into floating body region 24. The restore operation (data restoration from non-volatile memory to volatile memory) is described with reference to FIGS. 8A and 8B. Prior to the restore operation/process, the floating body 24 is set to a neutral or negative charge, i.e., a "0" state is written to floating body 24.

Figure 8A:
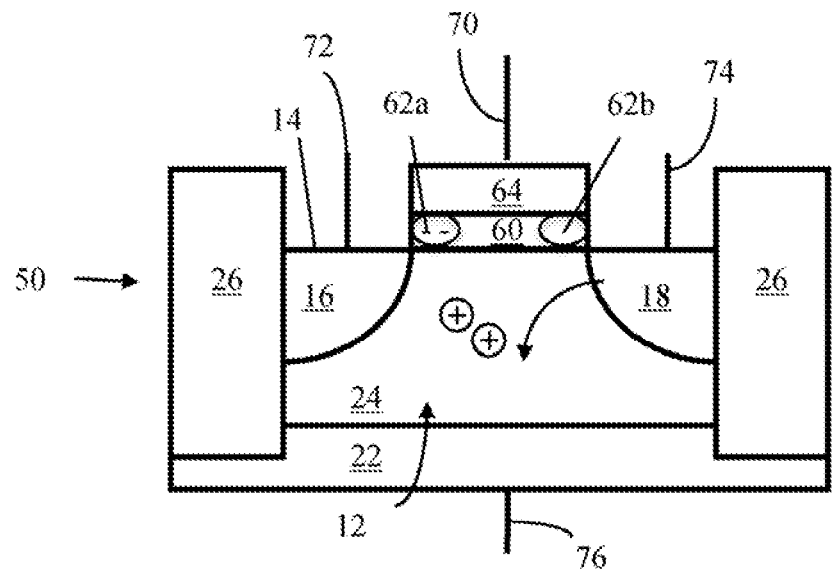
FIGS. 8A and 8B illustrate restore operations according to the present invention.
Figure 8B:
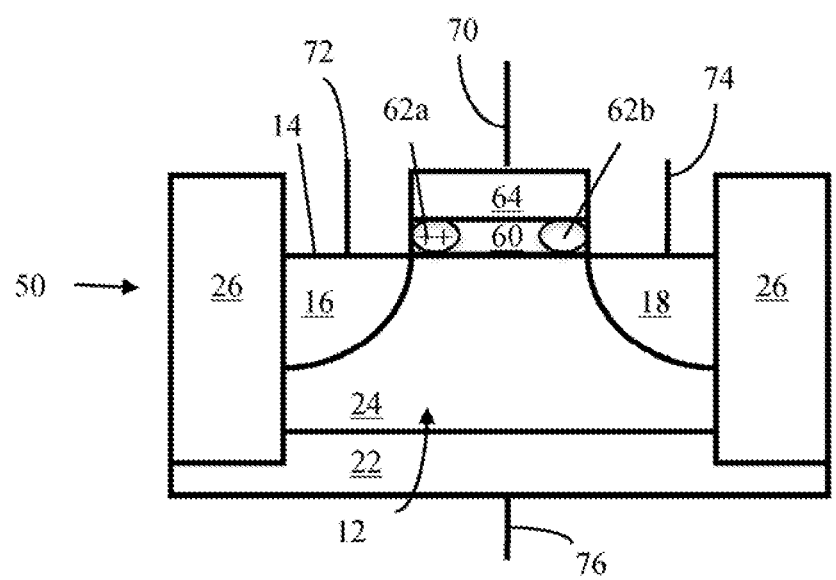

In the embodiment of FIGS. 8A-8B, to perform the restore operation of non-volatile data stored in storage location 62a, terminal 72 is set to a substantially neutral voltage, a positive voltage is applied to terminal 74, a negative voltage, or up to a slightly positive voltage, is applied to terminal 70 and a positive voltage that is less positive that the positive voltage applied to terminal 74 is applied to terminal 76. The positive voltage that is applied to terminal 74 creates a depletion region, shielding the effects of charge stored in storage location 62b. If the storage location 62a is negatively charged, as illustrated in FIG. 8A, this negative charge enhances the driving force for the band-to-band hot hole injection process, whereby holes are injected from the n-region 18 into floating body 24, thereby restoring the "1" state that the volatile memory cell 50 had held prior to the performance of the shadowing operation. Alternatively, if the storage location 62a of trapping layer 60 is not negatively charged, such as when the storage location 62a is positively charged as shown in FIG. 8B or is neutral, the hot band-to-band hole injection process does not occur, as illustrated in FIG. 8B, resulting in memory cell 50 having a "0" state, just as it did prior to performance of the shadowing process. Accordingly if storage location 62a has a positive charge after shadowing is performed, the volatile memory of floating body 24 will be restored to have a negative charge ("0" state), but if the storage location 62a has a negative or neutral charge, the volatile memory of floating body 24 will be restored to have a positive charge ("1" state).

In one particular non-limiting embodiment, a voltage of about 0.0 volts is applied to terminal 72, a voltage of about +2.0 volts is applied to terminal 74, a voltage of about −0.5 volts is applied to terminal 70, and a voltage of about +0.6 volts is applied to terminal 76. However, these voltage levels may vary, while maintaining the relative relationships between the voltages applied, as described above. For example, terminal 72 is grounded and is thus at about 0.0 volts, voltage applied to terminal 74 may be in the range of about +1.2 volts to about +3.0 volts, voltage applied to terminal 70 may be in the range of about −1.0 volts to about +1.0 volts, and voltage applied to terminal 76 may be in the range of about 0.0 volts to about +1.0 volts.

A restore operation of the non-volatile data stored in storage location 62b can be performed, in a similar manner to that described above for performing a restore operation of the non-volatile data stored in storage location 62a, by reversing the voltages applied to terminals 72 and 74 for the restore operation from storage location 62a.

Figure 9:
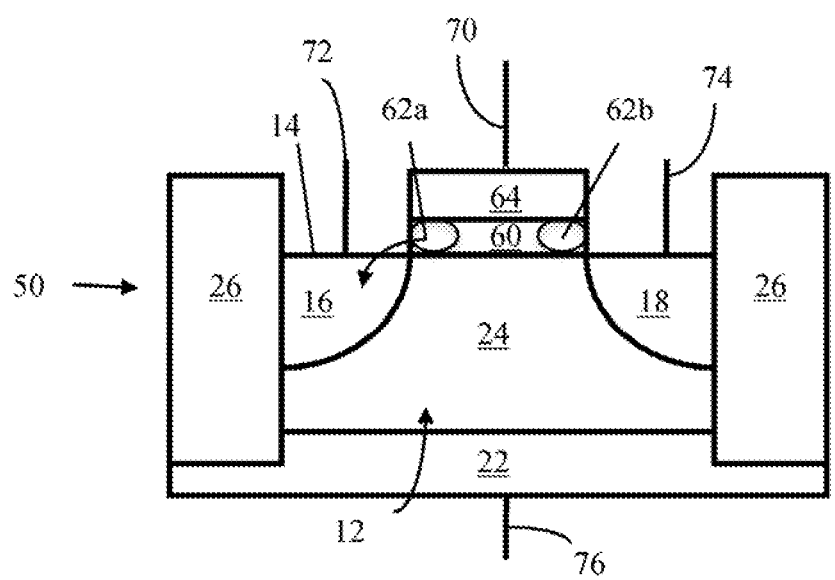
FIG. 9 illustrates resetting at least one trapping layer to a predetermined state.

After the restore operation has been completed, the state of the storage locations 62a, 62b of trapping layer 60 can be reset to an initial state. The reset operation of non-volatile storage location 62a is described with reference to FIG. 9. A high negative voltage is applied to terminal 70, a neutral or positive voltage is applied to terminal 72, a positive voltage is applied to terminal 76 and terminal 74 is left floating. Under these conditions, electrons tunnel from storage location 62a to the n+ junction region 16. As a result, the storage location 62a becomes positively charged.

In one particular non-limiting example of a reset process according to this embodiment, about −18 volts are applied to terminal 70, about 0.0 volts are applied to terminal 72, about +0.6 volts are applied to terminal 76, and terminal 74 is left floating. However, these voltage levels may vary, while maintaining the relative relationships between the voltages applied, as described above. For example, voltage applied to terminal 70 may be in the range of about −12.0 volts to about −20.0 volts, voltage applied to terminal 72 may be I the range of about 0.0 volts to about +3.0 volts, and voltage applied to terminal 76 may be in the range of about 0.0 volts to about +1.0 volts.

A reset operation of the non-volatile storage location 62b can be independently performed, in a similar manner to that described above for performing a reset operation of the non-volatile storage location 62a, by applying the voltages applied to terminal 72 for the reset operation of storage location 62a, to terminal 74 for the reset operation of storage location 62b and by letting terminal 72 float.

A reset operation can be performed simultaneously to both storage locations 62a and 62b by applying a high negative voltage to terminal 70, applying equal neutral or positive voltages to terminals 72 and 74, and by applying a voltage of about +0.6 volts to terminal 76. These voltage levels may vary, as long as maintenance of the relative relationships between the voltages applied are maintained as described above. For example, voltage applied to terminal 70 may be a voltage in the range of from about −12.0 volts to about −20.0 volts, voltage applied to both terminals 72 and 74 may be in the range of about 0.0 volts to about +3.0 volts, and voltage applied to terminal 76 may be in the range of about 0.0 volts to about +1.0 volts.

From the above description, it can be seen that the present invention provides a semiconductor memory cell having volatile and multi-bit, non-volatile functionality, as well as devices comprising a plurality of these cells.

Figure 10:
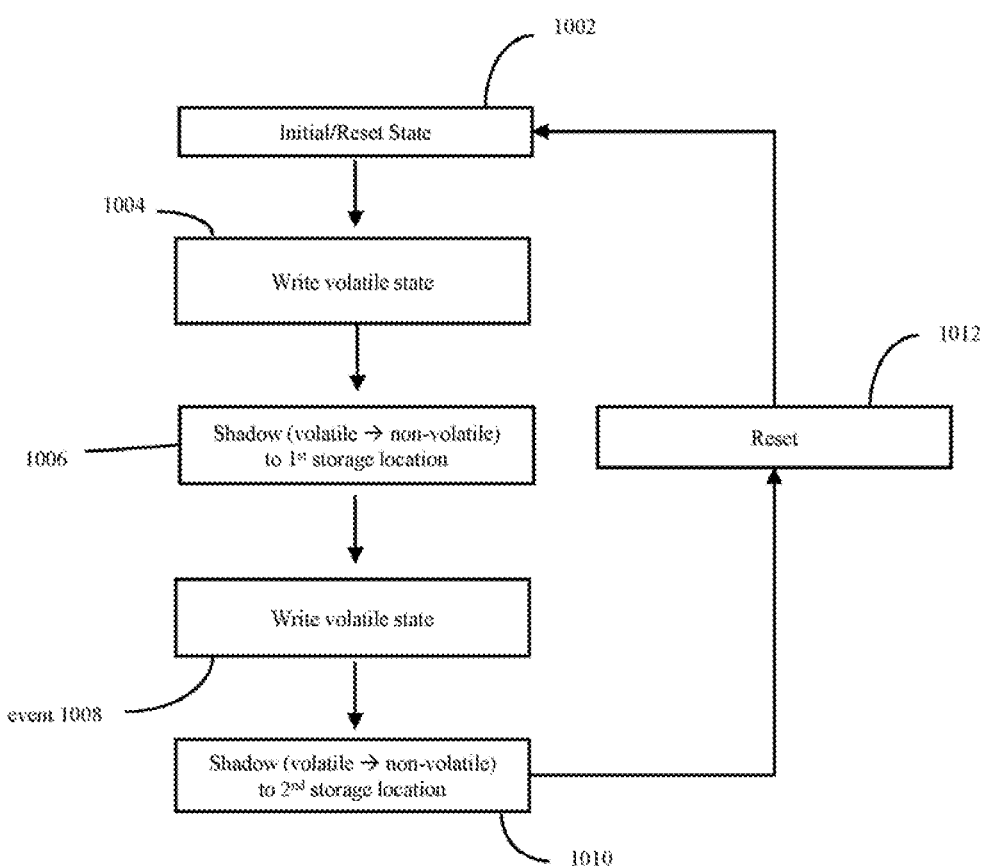
FIG. 10 is a flow chart illustrating the application of a memory cell, according to an embodiment of the present invention, as a multi-bit non-volatile memory with fast read/write speed.

According to one embodiment, the present invention can be used as non-volatile memory with fast read/write speed, using the volatile memory as a write buffer. FIG. 10 is a flow chart describing operations that are performed when using the present invention as non-volatile memory with fast read/write speed. At event 1002, when a non-volatile write is to be performed, the memory device is placed in an initial state by setting the non-volatile memory to a predetermined state. Depending on the non-volatile data to be written, both non-volatile storage locations of a cell can be reset, or only one of the two storage locations 62a or 62b can be reset at event 1012. At event 1004, the data is first written to the floating body region 24. Data is written to the floating body region 24 using write "1" and write "0" operations described above (e.g., see FIGS. 4 and 5 and the descriptions thereof).

After the volatile write operations has been completed for a segment of the memory array/memory device (for example, row 1 (R1) in FIG. 3), the content of the volatile data is then shadowed to the first non-volatile storage location (either storage location 62a or 62b) at shadowing event 1006. The data is written from the floating body region 24 to the non-volatile state (storage location 62a or 62b) in a mass parallel, non-algorithmic manner, using the shadowing operation described above, such that shadowing occurs in all cell of the segment simultaneously. Simultaneous to the shadowing event 1006, more data can be written to the floating body regions 24 of the memory cells 50 at other locations of the memory array (for example, row R2 in this case)

Thus, this embodiment can be used to improve the writing speed of a non-volatile memory device. By using the floating body regions 24 of the cells 50 as a buffer in this manner, this greatly increases the speed of storing nonvolatile memory (i.e., writing).

For example, the writing speed of data to a prior art flash memory device that does not include the volatile memory buffer of the present invention takes about 10 μsec (microseconds) to write a bit of data at a first location before moving on to store the next bit of data at the next cell. With the present invention, writing to volatile memory (i.e., the floating body 24) of cell 50 takes about 10 nsec (nanoseconds). Accordingly this process is three orders of magnitude faster than the conventional non-volatile flash memory, and data can be written to the floating bodies of many cells 50 as a buffer storage area while the writing from volatile to non-volatile memory proceeds in a mass parallel, non algorithmic manner.

Once the volatile data for a segment of the memory array (for example, an entire row of cells 50, or some other segment) have been shadowed to the non-volatile storage locations (either in storage location 62*a* or storage location 62*b* of the cells 50 in the segment, respectively), processing continues for non-volatile storage of data in the other storage location (62*a* or 62*b*) of each cell. Thus, after data has been written from floating body 24 to the first storage location (62*a* or 62*b*), for example, in the last column C8 in FIG. 3, and the volatile data in the floating body 24 at first column C1 has been shadowed to the first or second storage location (62*a* or 62*b*) of trapping layer 60, data can then be written to volatile storage in floating body 24 in C1 for subsequent writing to non-volatile storage in the other storage location (62*a* or 62*b*). The volatile data is written to the volatile storage in floating body region 24 of the memory cells 50 that have completed the shadowing operation at event 1006 (for example, referring to FIG. 3, from column 1 (C1) in row 1 (R1)). In the same manner, after the volatile data has been written to the floating body region 24, a shadowing operation to the second storage location (62*a* or 62*b*) can be performed at event 1010.

Figure 11A:
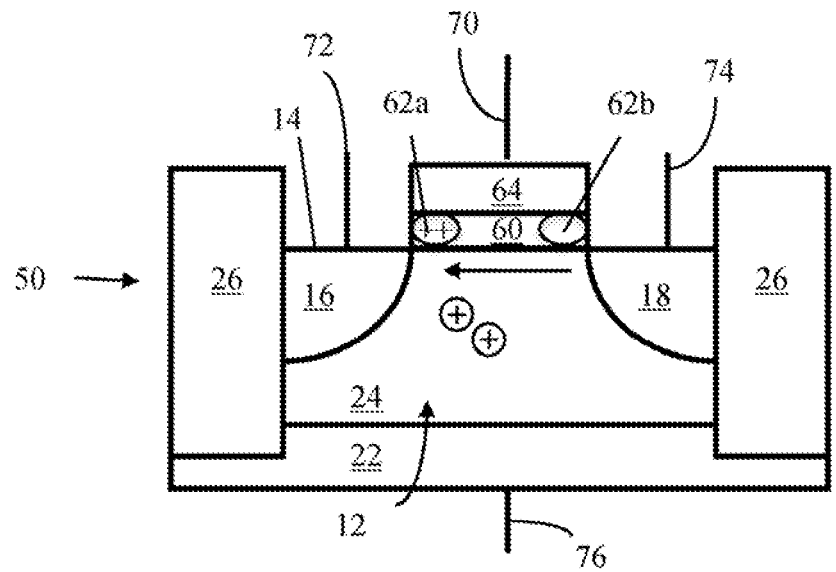
FIGS. 11A-11B illustrate a read operation of the non-volatile state of a memory cell according to an embodiment of the present invention.
Figure 11B:
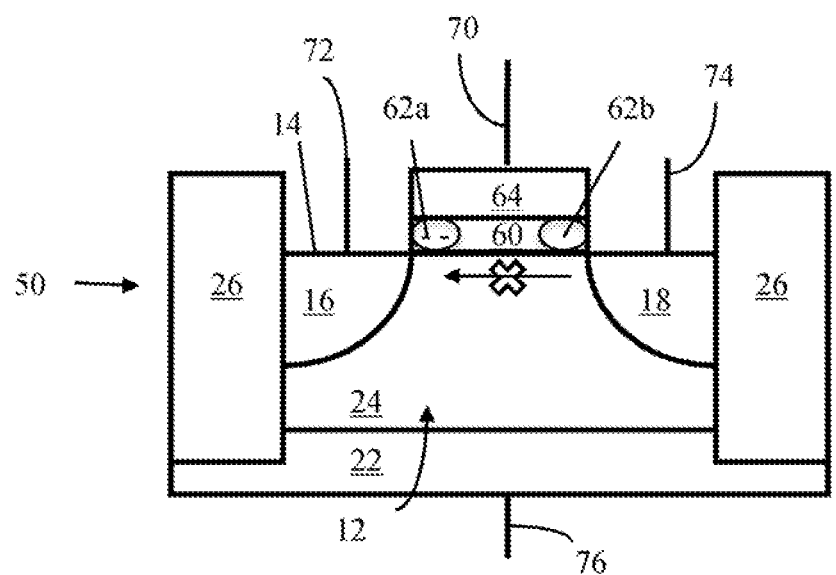

Data written to the non-volatile storage can be read as described below, with reference to FIGS. 11A-11B. To read the data in storage location 62*a*, a substantially neutral or relatively low positive voltage is applied to BL1 terminal 72, a positive voltage higher than the voltage applied to terminal 72 is applied to BL2 terminal 74, a positive voltage that is more positive than the positive voltage applied to terminal 74 is applied to WL terminal 70 and a positive voltage that is less than the positive voltage applied to terminal 70 is applied to BW terminal 76. The positive voltage applied to BL2 terminal 74 creates a depletion region that shields the effects of charges stored in storage location 62*b*. If storage location 62*a* is positively charged, i.e., in a state "1" (FIG. 11A), then a lower threshold voltage is observed compared to the threshold voltage observed when cell 50 (i.e., charge on storage location 62*a*) is negatively charged, i.e., in a state "0".

In one particular non-limiting example of a read operation of non-volatile data in storage location 62*a*, about 0.0 volts are applied to terminal 72, about +0.4 volts are applied to terminal 74, about +1.2 volts are applied to terminal 70, and about +0.6 volts are applied to terminal 76. However, these voltage levels may vary, while maintaining the relative relationships between the voltages applied, as described above. For example, terminal 72 is grounded and is thus at about 0.0 volts, voltage applied to terminal 74 may be in the range of about +0.1 volts to about +1.0 volts, voltage applied to terminal 70 may be in the range of about +1.0 volts to about +3.0 volts, and voltage applied to terminal 76 may be in the range of about 0.0 volts to about +1.0 volts.

A read operation of non-volatile data in the storage location 62*b* can be independently performed, in a similar manner to that described above for performing a read operation of non-volatile data in the storage location 62*a*, by reversing the voltages applied to terminals 72 and 74.

Figure 12:
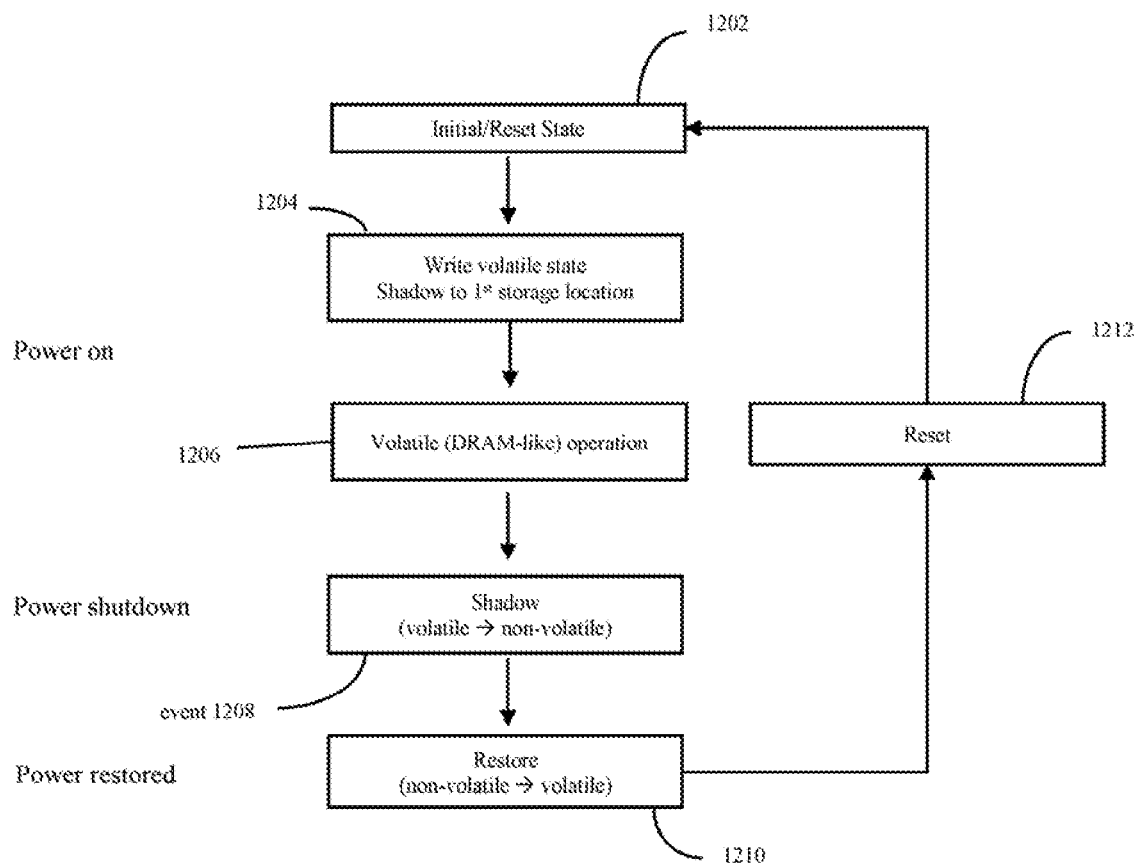
FIG. 12 is a flow chart illustrating the application of an embodiment of a memory cell device according to the present invention, wherein each memory cell is usable to store multiple bits of data, and wherein one bit of each cell has both volatile and non-volatile functionality, while another bit of each cell is useable to store non-volatile data.

In an alternative use, a memory device according to the present invention can be used to store multiple bits of data in each memory cell 50, wherein one bit of the cell 50 provides both volatile and non-volatile functionality and the other bit of the cell 50 is use to store non-volatile data as "permanent data", which is data that does not change in value during routine use. For example, the non-volatile storage bits can be used to store applications, programs, etc. and/or data that is not frequently modified, such as an operating system image, multimedia files, etc. The bits having both volatile and non-volatile functionality can be used to store state variable, etc. that can be stored in the absence of power. FIG. 12 is a flowchart illustrating an example of this type of use.

After initializing or resetting the memory at event 1202, the non-volatile bit of the memory cell (i.e., storage location 62*a* or storage location 62*b*, whichever is being used for the non-volatile bit) is written in the same manner as described above, by first writing the volatile state (i.e., writing "1" or "0" to floating body 24) followed by a mass parallel, non-algorithmic shadowing operation to one of the storage locations of the respective cells 50 (e.g., storage location 62*a* or 62*b*), see event 1204.

Subsequently, the floating body 24 is used to store volatile state information at event 1206. When power down is detected, e.g., wherein a user turns off the power to cell/cells 50, or the power is inadvertently interrupted, or for any other reason, power is at least discontinued to cell 50, or due to any specific commands by the user such as during a backup operation, or when non-volatile data stored in storage location 62*a* (or 62*b*, depending upon which storage location is being used as the non-volatile bit), data stored in the floating body region 24 is transferred (event 1208) to storage location 62*b* (when storage location 62*a* is used as the non-volatile bit) through a hot electron injection mechanism described above. When power is restored to the cell 50, the state of the cell 50 as stored on trapping layer 60 (in storage location 62*b*, for this example) is restored into floating body region 24 at event 1210, by a restore operation already previously described above, and then the state of storage location 62*b* is reset at event 1212.

Figure 13:
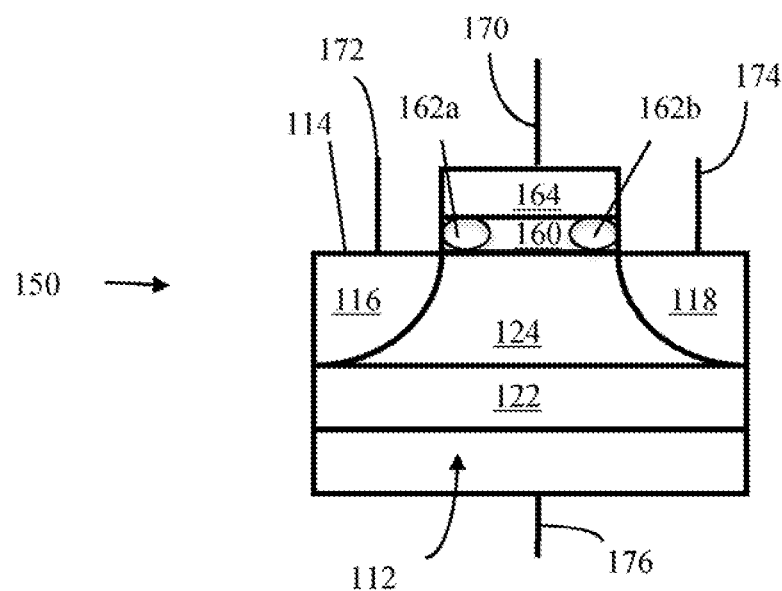
FIG. 13 is a schematic, cross-sectional representation of another embodiment of a memory cell according to the present invention.

FIG. 13 schematically illustrates another embodiment of a memory cell 150 according to the present invention. Cell 150 includes a substrate 112 of a first conductivity type, such as a p-type conductivity type, for example. Substrate 112 is typically made of silicon, but may comprise germanium, silicon germanium, gallium arsenide, carbon nanotubes, or other semiconductor materials known in the art. The substrate 112 has a surface 114. A first region 116 having a second conductivity type, such as n-type, for example, is provided in substrate 112 and which is exposed at surface 114. A second region 118 having the second conductivity type is also provided in substrate 112, which is exposed at surface 114 and which is spaced apart from the first region 116. First and second regions 116 and 118 are formed by an implantation process formed on the material making up substrate 112, according to any of implantation processes known and typically used in the art.

A buried layer 122, such as buried oxide (BOX) is also provided in the substrate 112, buried in the substrate, 112 as shown. A body region 124 of the substrate 112 is completely bounded by surface 114, first and second regions 116,118 and the buried insulating layer 122. A trapping layer 160 is positioned in between the regions 116 and 118, and above the surface 114. Trapping layer 160 may be made of silicon nitride, silicon nanocrystal or high-K dielectric materials or other dielectric materials. Trapping layer 160 is an insulator layer and functions to store non-volatile memory data. Trapping layer 160 may have two physically separated storage locations 162a, 162b, so that each cell 150 provides multi-bit, non-volatile storing functionality.

A control gate 164 is positioned above trapping layer 160 such that trapping layer 160 is positioned between control gate 164 and surface 114, as shown in FIG. 13. Control gate 164 is typically made of polysilicon material or metal gate electrode, such as tungsten, tantalum, titanium and/or their nitrides. The relationship between the trapping layer 160 and control gate 164 is similar to that of a trapped charge-based nonvolatile memory cell. The trapping layer 160 functions to store non-volatile memory data and the control gate 164 is used for memory cell selection (for example, to select rows in a memory cell array/device).

Cell 150 includes four terminals: word line (WL) terminal 170, bit line (BL1 and BL2) terminals 172 and 174 and substrate terminal 176. Terminal 170 is connected to control gate 164. Terminal 172 is connected to first region 116 and terminal 174 is connected to second region 118. Alternatively, terminal 172 can be connected to second region 118 and terminal 174 can be connected to first region 116. Terminal 176 is connected to the substrate 112.

Figure 14:
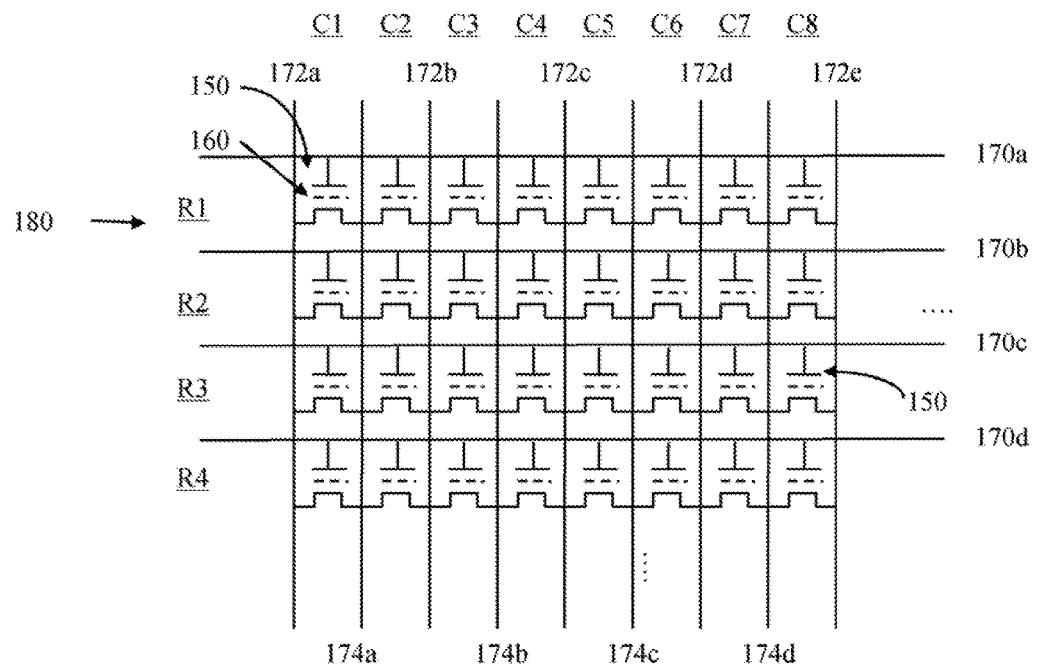
FIG. 14 is a schematic diagram showing an example of array architecture of another embodiment of a memory cell according to the present invention.

FIG. 14 shows an example of an array architecture 180 of a memory cell device according to the present invention, wherein memory cells 150 are arranged in a plurality of rows and columns. Alternatively, a memory cell device according to the present invention may be provided in a single row or column of a plurality of cells 150, but typically both a plurality of rows and a plurality of columns are provided. Memory cells 150 are connected such that within each row, all of the control gates 164 are connected in a common word line terminal 70 (i.e., 70a, 70b . . . , etc., depending on which row is being described). Within each column, all first and second regions 116, 118 of cells 150 in that column are connected in common bit line terminals 172 (i.e., 172a, 172b . . . , etc.) and 174 (i.e., 174a, 174b . . . , etc.).

Figure 15:
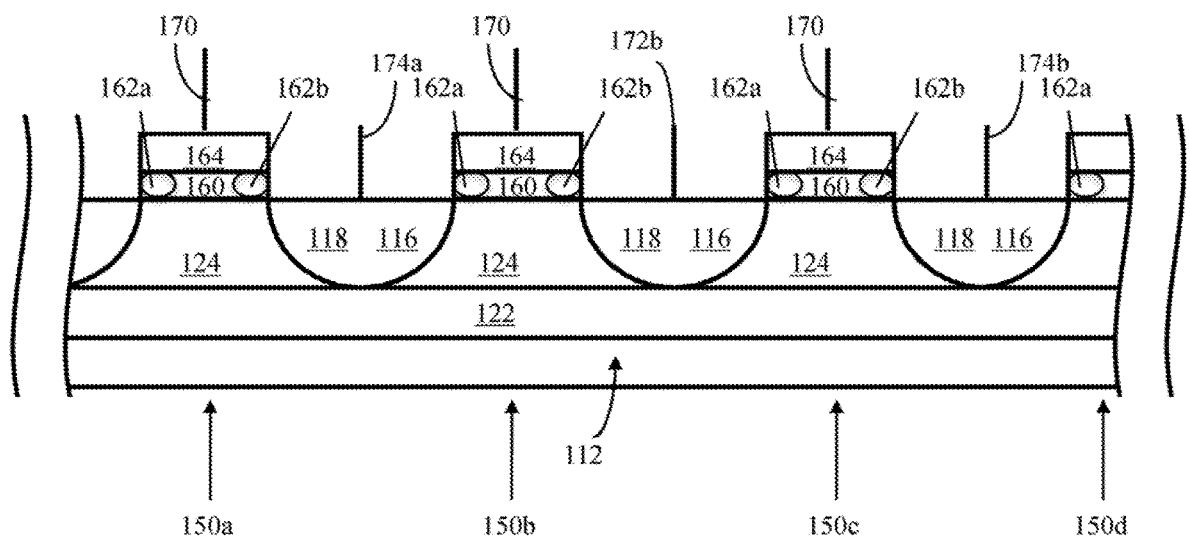
FIG. 15 illustrates an example of a partial row of memory cells assembled in a memory device according to the architecture shown in FIG. 14.

Because each cell 150 is provided with a buried insulator layer 122 that, together with regions 116 and 118, bound the lower and side boundaries of floating body 124, insulating layers 26 are not required to bound the sides of the floating body 24 like in the embodiment of FIG. 2. Because insulating layers 26 are not required by cells 150, less terminals are required for operation of the memory cells 150 in an array of such cells assembled into a memory cell device. FIG. 15 illustrates an example of a partial row of memory cells 150 assembled in a memory device according to the architecture shown in FIG. 14. Because the adjacent cells 150 are not isolated by insulating layer 26, adjacent regions 116, 118 are also not isolated by insulating layer 26. Accordingly, a single terminal 172 or 174 can be used to function as terminal 174 for region 118 of one a pair of adjacent cells 150, and, by reversing the polarity thereof, can also be used to function as terminal 172 for region 116 of the other cell of the pair, where region 118 of the first cell contacts region 116 of the second cell 150. For example, in FIG. 15, terminal 174a can be operated to function as terminal 174 for region 118 of cell 150a and, by reversing the polarity of the voltage applied to terminal 174a, terminal 174a can be operated to function as terminal 172 for region 116 of cell 150b. By reducing the number of terminals required in a memory cell device in this way, the present invention can be manufactured to have a smaller volume, relative to a memory cell device of the same capacity that requires a pair of terminals 172, 174 for each cell that are separate from the terminals 172, 174 of the adjacent cells in the row.

Figure 16A:
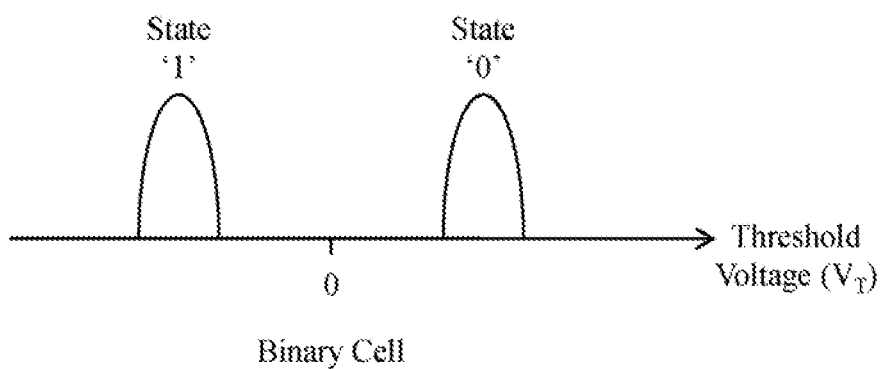
FIG. 16A illustrates the binary states of each non-volatile storage location, relative to threshold voltage.
Figure 16B:
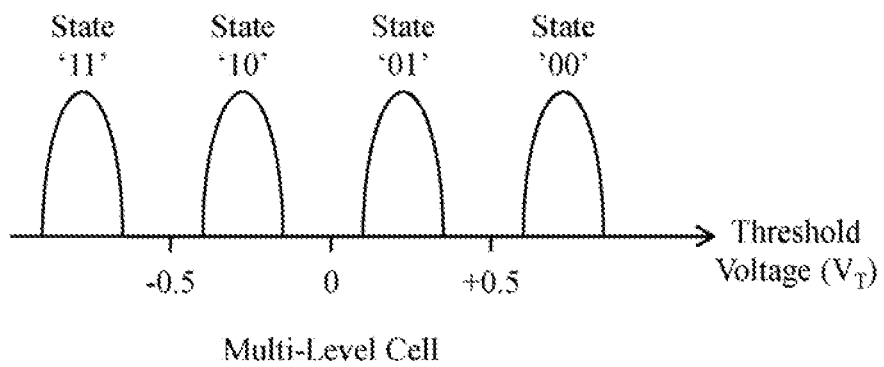
FIG. 16B illustrates the multi-level states of each non-volatile storage location, relative to threshold voltage.

Up until this point, the description of cells 50 and 150 have been in regard to binary cells, in which the data memories, both volatile and non-volatile, are binary, meaning that they either store state "1" or state "0". FIG. 16A illustrates the states of a binary cell, relative to threshold voltage, wherein a threshold voltage less than or equal to a predetermined voltage (in one example, the predetermined voltage is 0 volts, but the predetermined voltage may be a higher or lower voltage) in memory cell 50 or 150 is interpreted as state "1", and a voltage greater than the predetermined voltage in memory cell 50 or 150 is interpreted as state "0". However, in an alternative embodiment, the memory cells described herein can be configured to function as multi-level cells, so that more than one bit of data can be stored in each cell 50,150. FIG. 16B illustrates an example of voltage states of a multi-level cell wherein two bits of data can be stored in each storage location 62a, 62b, 162a, 162b. In this case, a threshold voltage less than or equal to a first predetermined voltage (e.g., 0 volts or some other predetermined voltage) and greater than a second predetermined voltage that is less than the first predetermined voltage (e.g., about −0.5 volts or some other voltage less than the first predetermined voltage) in memory cell 50,150 is interpreted as state "10", a voltage less than or equal to the second predetermined voltage is interpreted as state "11", a voltage greater than the first predetermined voltage and less than or equal to a third predetermined voltage that is greater than the first predetermined voltage (e.g., about +0.5 volts or some other predetermined voltage that is greater than the first predetermined voltage) is interpreted to be state "01" and a voltage greater than the third predetermined voltage is interpreted as state "00". Each of the non-volatile storage locations (e.g. storage locations 62a and 62b or 162a and 162b) can store multi-bit data, hence further increase the number of bits stored on each memory cells 50 and 150. Further details about multi-level operation can be found in co-pending, commonly owned application Ser. No. 11/998,311 filed Nov. 29, 2007, now U.S. Pat. No. 7,760,548. application Ser. No. 11/998,311 is hereby incorporated herein, in its entirety, by reference thereto.

From the foregoing, it can be seen that with the present invention, a semiconductor memory having volatile and multi-bit, non-volatile functionality is achieved. While the present invention has been described with reference to the specific embodiments thereof, and enable one of ordinary skill in the art to make and use what is considered presently to be the best mode thereof, it should be understood by those of ordinary skill in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A memory array comprising a plurality of rows and columns of semiconductor memory cells, a plurality of said cells each comprising:
    a substrate having a first conductivity type;
    a first region embedded in the substrate at a first location of the substrate and having a second conductivity type;
    a second region embedded in the substrate at a second location of the substrate and having the second conductivity type, such that at least a portion of the substrate having the first conductivity type is located between the first and second locations and functions as a floating body to store data as volatile memory;

a trapping layer positioned in between the first and second locations and above a surface of the substrate, the trapping layer comprising first and second storage locations configured to store data as nonvolatile memory independently of one another; and wherein charge flow into said floating body upon restoration of power to said memory cell depends on charge stored in one of said first and second storage locations in said trapping layer so that said memory cell provides both volatile and non-volatile memory functionality, and the other of said first and second storage locations is configured to store non-volatile data that is not used as volatile memory by said floating body.

2. The memory array of claim 1, further comprising control terminals electrically connecting the rows of said memory array, respectively, to a control gate.

3. The memory array of claim 1, wherein said plurality of memory cells each comprise a buried layer, electrically connected to a control terminal that is shared among at least two of said plurality of memory cells.

4. The memory array of claim 1, further comprising a buried insulator layer bounding a bottom of said floating body.

5. The memory array of claim 1, further comprising control terminals defining the columns of said memory array.

6. The memory array of claim 5, wherein the number of said control terminals defining the columns is equal to twice the number of the columns.

7. The memory array of claim 5, wherein the number of said control terminals defining the columns is equal to the number of the columns plus one.

8. The memory array of claim 1, wherein said memory cells function as binary cells.

9. The memory array of claim 1, wherein said memory cells function as multi-level cells.

10. An integrated circuit comprising a plurality of rows and columns of semiconductor memory cells, a plurality of said cells each comprising:

a substrate having a first conductivity type;

a first region embedded in the substrate at a first location of the substrate and having a second conductivity type;

a second region embedded in the substrate at a second location of the substrate and having the second conductivity type, such that at least a portion of the substrate having the first conductivity type is located between the first and second locations and functions as a floating body to store data as volatile memory;

a trapping layer positioned in between the first and second locations and above a surface of the substrate, the trapping layer comprising first and second storage locations configured to store data as non-volatile memory independently of one another;

wherein charge flow into said floating body upon restoration of power to said memory cell depends on charge stored in one of said first and second storage locations in said trapping layer so that said memory cell provides both volatile and non-volatile memory functionality, and the other of said first and second storage locations is configured to store non-volatile data that is not used as volatile memory by said floating body; and a control circuit configured to perform a restore operation to transfer said non-volatile data in said one of said first and second storage locations in a first memory cell of said plurality of cells to volatile data as said charge stored in said floating body region of said first memory cell and to transfer said non-volatile data in said one of said first and second storage locations in a second memory cell of said plurality of cells to volatile data as said charge stored in said floating body region of said second memory cell.

11. The integrated circuit of claim 10, wherein each of said plurality of cells further comprises a control gate, said integrated circuit further comprising control terminals electrically connecting the rows of said integrated circuit, respectively, to said control gates.

12. The integrated circuit of claim 10, wherein said plurality of memory cells each comprise a buried layer, electrically connected to a control terminal that is shared among at least two of said plurality of memory cells.

13. The integrated circuit of claim 10, further comprising a buried insulator layer bounding a bottom of said floating body.

14. The integrated circuit of claim 10, further comprising control terminals defining the columns of said integrated circuit.

15. The integrated circuit of claim 14, wherein the number of said control terminals defining the columns is equal to twice the number of the columns.

16. The integrated circuit of claim 14, wherein the number of said control terminals defining the columns is equal to the number of the columns plus one.

17. The integrated circuit of claim 10, wherein said memory cells function as binary cells.

18. The integrated circuit of claim 10, wherein said memory cells function as multi-level cells.

* * * * *